US011004745B2

(12) United States Patent
Lin et al.

(10) Patent No.: US 11,004,745 B2
(45) Date of Patent: *May 11, 2021

(54) SEMICONDUCTOR DEVICE CONVEX SOURCE/DRAIN REGION

(71) Applicant: Taiwan Semiconductor Manufacturing Company, Ltd., Hsinchu (TW)

(72) Inventors: Tzu-Ching Lin, Hsinchu (TW); Chii-Horng Li, Zhubei (TW); Chien-I Kuo, Hsinchu (TW); Li-Li Su, ChuBei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/710,021

(22) Filed: Dec. 11, 2019

(65) Prior Publication Data
US 2020/0111711 A1    Apr. 9, 2020

Related U.S. Application Data

(63) Continuation of application No. 16/018,455, filed on Jun. 26, 2018, now Pat. No. 10,510,607.

(51) Int. Cl.
H01L 21/82 (2006.01)
H01L 21/08 (2006.01)
H01L 21/8234 (2006.01)
H01L 29/66 (2006.01)
H01L 29/78 (2006.01)
H01L 27/088 (2006.01)

(52) U.S. Cl.
CPC ........... *H01L 21/823418* (2013.01); *H01L 21/823431* (2013.01); *H01L 27/0886* (2013.01); *H01L 29/66545* (2013.01); *H01L 29/66795* (2013.01); *H01L 29/785* (2013.01)

(58) Field of Classification Search
CPC ..... H01L 2029/7858; H01L 21/823418; H01L 21/823431; H01L 27/0886; H01L 29/66545; H01L 29/66795; H01L 29/785
See application file for complete search history.

(56) References Cited

U.S. PATENT DOCUMENTS

| 9,287,382 B1 * | 3/2016 | Lee ................. H01L 27/092 |
| 9,570,556 B1 * | 2/2017 | Lee ................. H01L 29/785 |
| 2006/0286775 A1 * | 12/2006 | Singh ................. C30B 29/06 438/478 |
| 2014/0134818 A1 * | 5/2014 | Cheng ............ H01L 29/66636 438/300 |

(Continued)

*Primary Examiner* — Mohammed Shamsuzzaman
(74) *Attorney, Agent, or Firm* — Slater Matsil, LLP

(57) ABSTRACT

The present disclosure relates generally to an epitaxy scheme for forming source/drain regions in a semiconductor device, such as an n-channel device. In an example, a method of manufacturing a semiconductor device is provided. The method generally includes forming a recess in a fin, the fin being on a substrate. The recess is proximate a gate structure over the fin. The method includes epitaxially growing a source/drain region in the recess using a remote plasma chemical vapor deposition (RPCVD) process. The RPCVD process includes using a silicon source precursor and a hydrogen carrier gas.

20 Claims, 13 Drawing Sheets

(56) References Cited

U.S. PATENT DOCUMENTS

| | | | |
|---|---|---|---|
| 2014/0319614 A1* | 10/2014 | Paul | H01L 29/785 257/365 |
| 2016/0190017 A1* | 6/2016 | Lee | H01L 21/0262 257/192 |
| 2017/0154996 A1* | 6/2017 | Lin | H01L 21/324 |

* cited by examiner

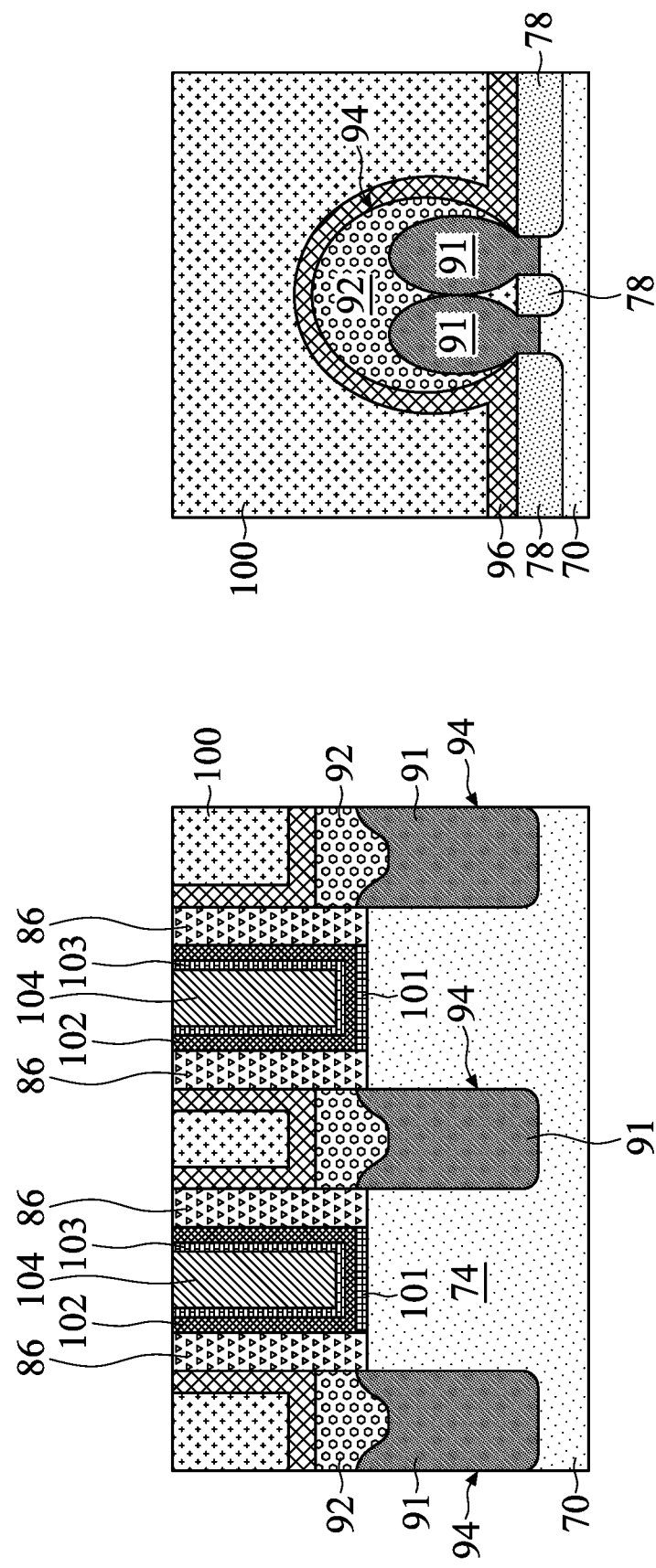

SEMICONDUCTOR DEVICE CONVEX SOURCE/DRAIN REGION

PRIORITY CLAIM

This application is a continuation of U.S. application Ser. No. 16/018,455, filed on Jun. 26, 2018, which application is hereby incorporated herein by reference.

BACKGROUND

Semiconductor devices are used in a variety of electronic applications, such as personal computers, cell phones, digital cameras, and other electronic equipment. As the semiconductor industry has progressed into nanometer technology process nodes in pursuit of higher device density, higher performance, low power consumption, and lower costs, challenges from both fabrication and design issues have resulted in the development of three-dimensional designs, such as a Fin Field Effect Transistor (FinFET). FinFET devices typically include semiconductor fins in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decrease in scaling, new challenges are presented to IC fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-C, 2A-B, 3A-B, 4A-B, 5A-D, 6A-B, 7A-B, and 8A-B are various views of respective intermediate structures at manufacturing stages in an example process of forming a semiconductor device, such as Fin Field-Effect Transistors (FinFETs), in accordance with some embodiments.

DETAILED DESCRIPTION

Figure 1B:
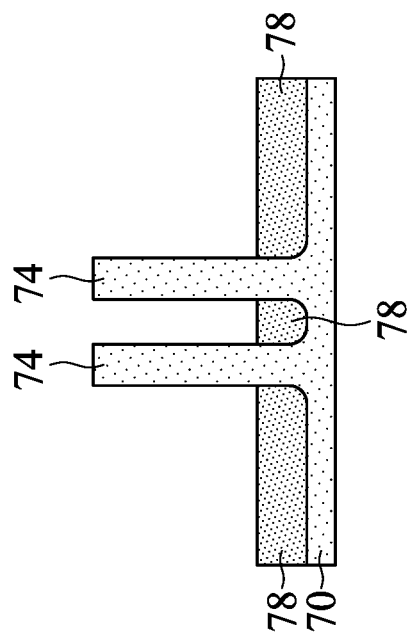

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the present disclosure relate to an epitaxial scheme for a source/drain region in a semiconductor device, such as an n-type Field Effect Transistor (nFET), which may be a Fin Field Effect Transistor (FinFET) device. Source/drain regions of transistors, for example, and methods for forming such features are described. Techniques and apparatus are provided herein for forming source/drain regions in a semiconductor device having a convex shape, which may achieve merger of inter-fin epitaxial regions (e.g., silicon phosphorous (SiP)) of neighboring source/drain regions. The convex shape can permit an increased volume in the source/drain regions and a larger landing area for a contact, which can further reduce contact resistance, source/drain region loss, and degradation of device performance. The techniques may provide a structure that is defect-free after formation of the source/drain region.

Example techniques for forming the source/drain regions are described and illustrated herein with respect to Fin Field-Effect Transistors (FinFETs); however, an epitaxy scheme within the scope of this disclosure can also be implemented in other semiconductor devices. Further, intermediate stages of forming FinFETs are illustrated. Some aspects described herein are described in the context of FinFETs formed using a replacement gate process. In other examples, a gate-first process is used, as a person of ordinary skill in the art will readily understand. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps described herein.

FIGS. 1A-C through 8A-B are views of respective intermediate structures at manufacturing stages in an example process of forming FinFETs in accordance with some embodiments.

Figure 1A:
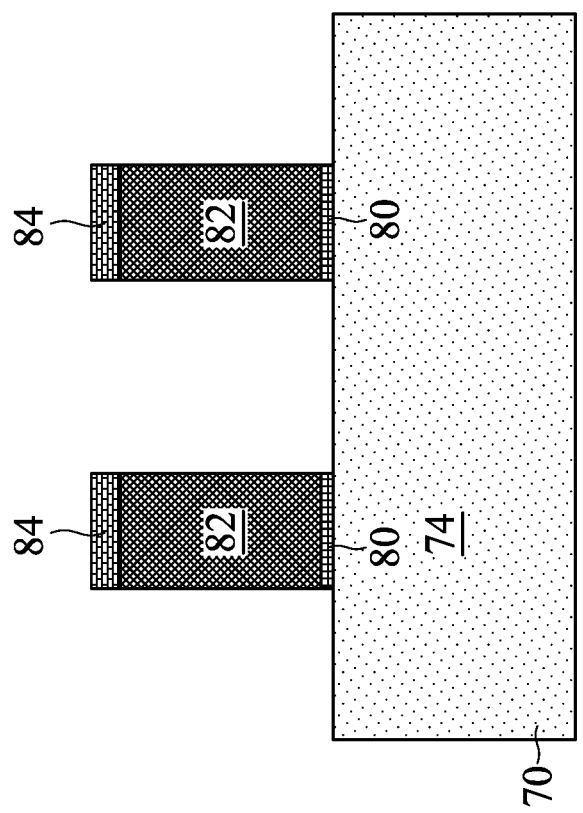
Figure 1C:
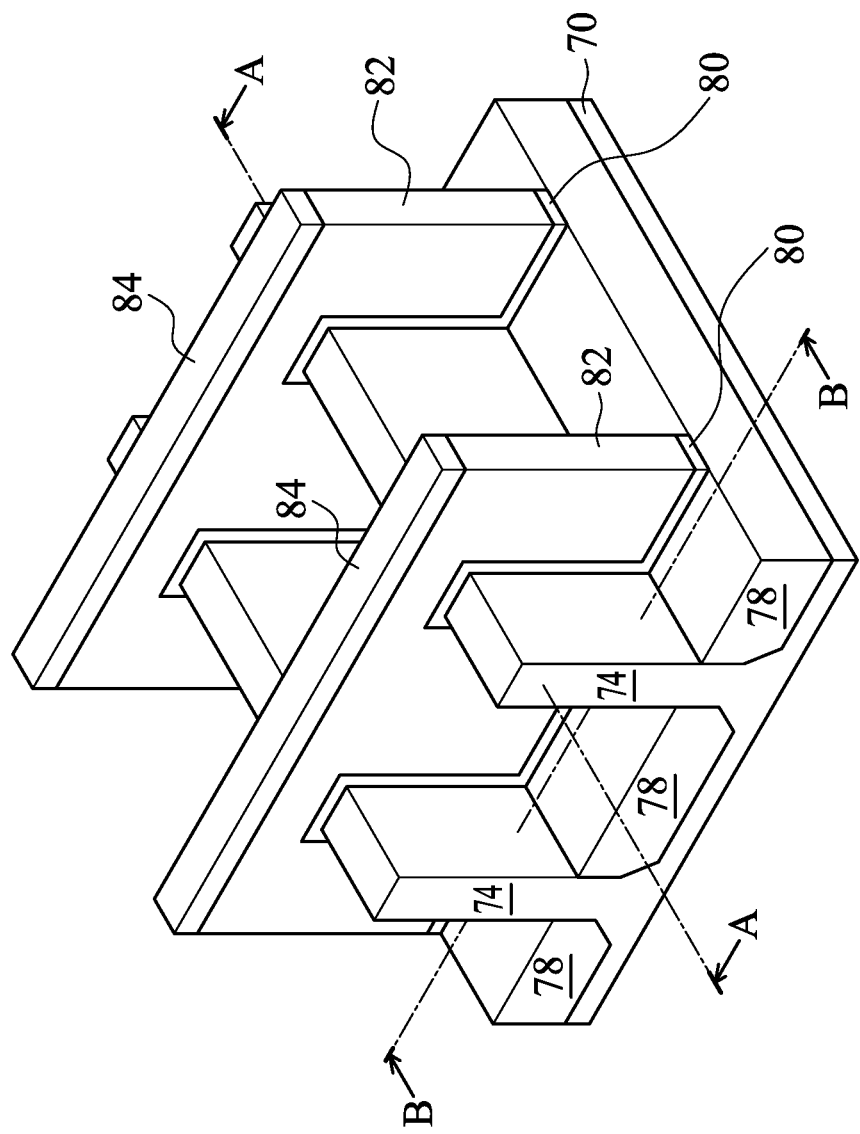

FIGS. 1A and 1B illustrate respective cross-sectional views of an intermediate structure, and FIG. 1C illustrates a perspective view of the intermediate structure. FIG. 1C illustrates reference cross-sections A-A and B-B that are references for cross-section views. Figures ending with an "A" designation illustrate cross-section views along cross-section A-A in FIG. 1C, and figures ending with a "B" designation illustrate cross-sectional views along cross-section B-B in FIG. 1C.

The intermediate structure of FIGS. 1A-C includes first and second fins 74 formed on a semiconductor substrate 70, with respective isolation regions 78 on the semiconductor substrate 70 between neighboring fins 74. First and second dummy gate stacks are along respective sidewalls of and over the fins 74. The first and second dummy gate stacks each include an interfacial dielectric 80, a dummy gate 82, and a mask 84.

In some examples, the semiconductor substrate 70 is or includes a bulk semiconductor substrate, a semiconductor-on-insulator (SOI) substrate, or the like, which is be doped (e.g., with a p-type or an n-type dopant) or is undoped. In some embodiments, the semiconductor material of the semiconductor substrate 70 includes an elemental semiconductor such as silicon (Si) or germanium (Ge); a compound semiconductor; an alloy semiconductor; or a combination thereof.

The fins 74 are formed in the semiconductor substrate 70. In some examples, the semiconductor substrate 70 is etched such that trenches are formed between neighboring pairs of fins 74 and such that the fins 74 protrude from the semiconductor substrate 70. The fins 74 and trenches may be patterned by any suitable method. In some examples, the fins 74 are patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over the semiconductor substrate 70 and patterned using a photolithography process. Spacers are formed alongside the patterned sacrificial layer using a self-aligned process. The sacrificial layer is then removed, and the remaining spacers are then be used to pattern the fins 74 and trenches.

Isolation regions 78 are formed with each being in a corresponding trench. The isolation regions 78 are or include an insulating material such as an oxide (such as silicon oxide), a nitride, the like, or a combination thereof, and the insulating material is deposited using an appropriate deposition process. The insulating material is recessed after being deposited to form the isolation regions 78. The insulating material is recessed such that the fins 74 protrude from between neighboring isolation regions 78, which may, at least in part, thereby delineate the fins 74 as active areas on the semiconductor substrate 70. A person having ordinary skill in the art will readily understand that the processes described above are just examples of how fins 74 may be formed. In other examples, the fins 74 are formed by other processes and may include heteroepitaxial and/or homoepitaxial structures.

The dummy gate stacks are formed on the fins 74. The interfacial dielectrics 80, dummy gates 82, and masks 84 for the dummy gate stacks are formed by sequentially forming respective layers by appropriate processes, and then patterning those layers into the dummy gate stacks by appropriate photolithography and etching processes. In some examples, the interfacial dielectrics 80 is or includes silicon oxide, silicon nitride, the like, or multilayers thereof. In some examples, the dummy gates 82 are or include silicon (e.g., polysilicon) or another material. In some examples, the masks 84 are or include silicon nitride, silicon oxynitride, silicon carbon nitride, the like, or a combination thereof.

Cross-section A-A in FIG. 1C is in a plane along, e.g., channels in one fin 74 between opposing source/drain regions. Cross-section B-B in FIG. 1C is in a plane perpendicular to cross-section A-A and is across respective source/drain regions in neighboring fins 74.

Figure 2B:
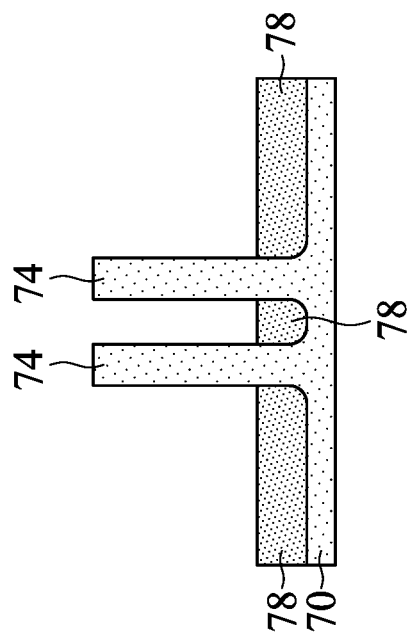
Figure 2A:
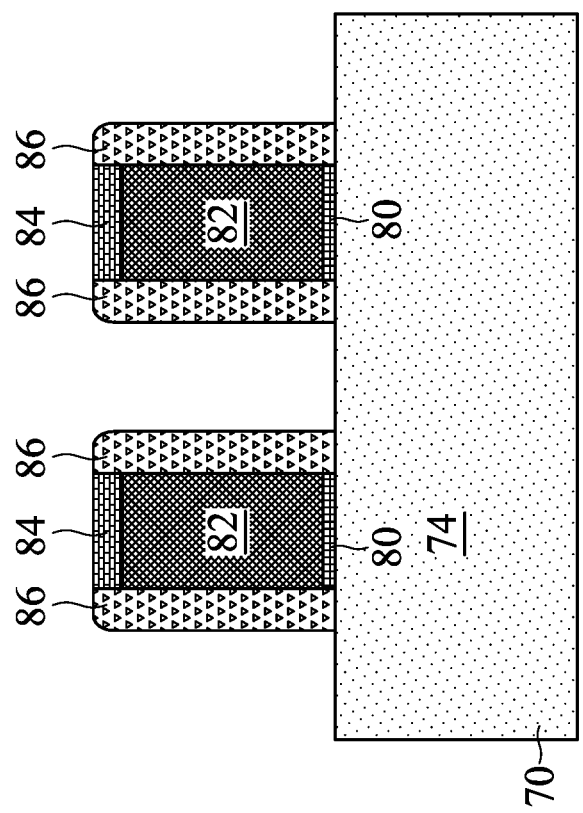

FIGS. 2A and 2B illustrate the formation of gate spacers 86. Gate spacers 86 are formed along sidewalls of the dummy gate stacks (e.g., sidewalls of the interfacial dielectric 80, dummy gate 82, and mask 84). The gate spacers 86 are formed by conformally depositing one or more layers for the gate spacers 86 and anisotropically etching the one or more layers, for example. In some examples, the one or more layers for the gate spacers 86 are or include silicon nitride, silicon oxynitride, silicon carbon nitride, the like, multi-layers thereof, or a combination thereof.

Figure 3B:
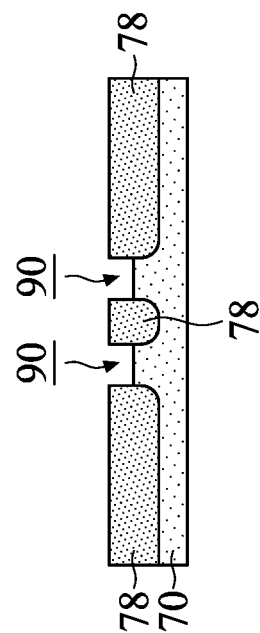
Figure 3A:
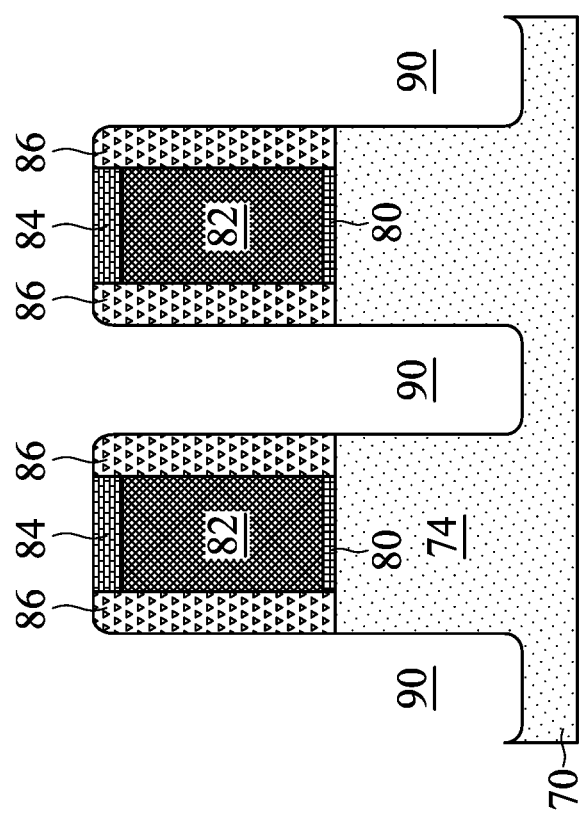

FIGS. 3A and 3B illustrate the formation of recesses 90 in the fins 74 for source/drain regions proximate the dummy gate stacks. As illustrated, the recesses 90 are formed in the fins 74 on opposing sides of the dummy gate stacks. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. In some examples, the etch process is a dry etch, such as a reactive ion etch (RIE), neutral beam etch (NBE), or the like, or a wet etch, such as using tetramethylammonium hydroxide (TMAH), ammonium hydroxide ($NH_4OH$), or another etchant.

FIGS. 4A-4B through 5A-5B illustrate the formation of epitaxial source/drain regions 94 in the recesses 90. Each epitaxial source/drain region 94 includes one or more inner portions 91 epitaxially grown along the surfaces of the respective recess 90, and an outer portion 92 epitaxially grown on the inner portions 91. The processes used for formation of the inner portions 91 and the outer portions 92 can result in merged epitaxial source/drain regions 94 between neighboring fins 74 having a convex shape (e.g., an apophysis shape) and having an increased volume in the epitaxial source/drain regions 94. In some examples, the epitaxial source/drain region 94 may have a defect-free structure, or reduced defects, after formation according to the techniques provided herein.

Figure 4A:
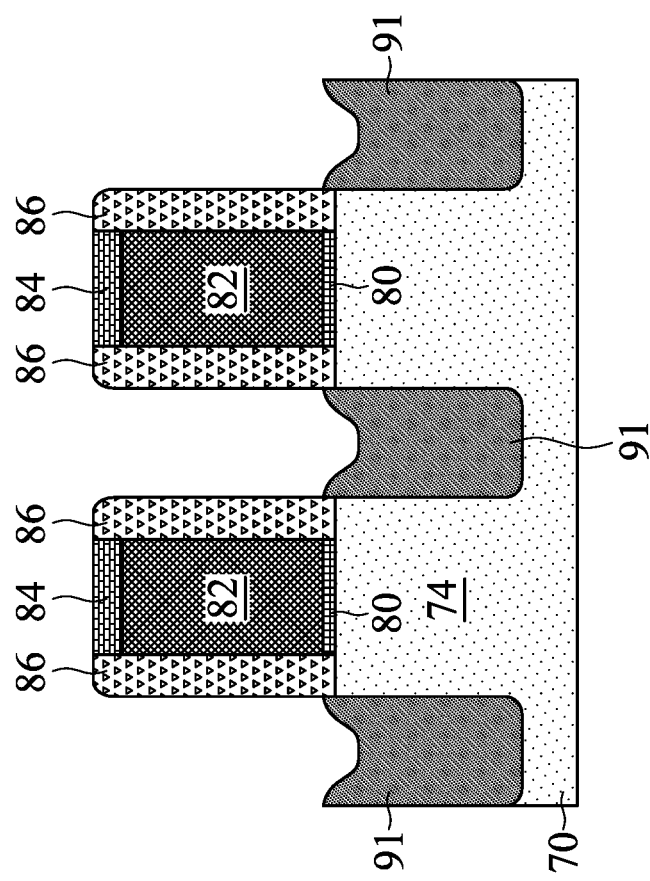
Figure 4B:
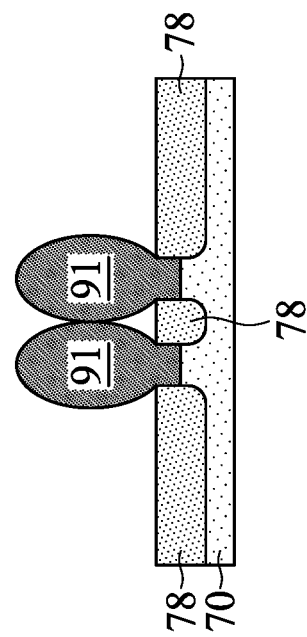

FIGS. 4A and 4B illustrate the formation of the inner portions 91 along surfaces in the recesses 90. In some examples, the inner portions 91 are formed by epitaxially growing the inner portions 91 on the surfaces in the recesses 90 of the fins 74. The inner portions 91 can be formed using a first epitaxy process. The first epitaxy process can be implemented by a cyclic deposition-etch (CDE) process. The CDE process includes a number of repeated cycles, such as in range from 1 cycle to 3 cycles. Each cycle of the CDE process includes a deposition process followed by an etch process.

In some examples, the deposition process of the CDE process includes a chemical vapor deposition (CVD) process, such as remote plasma chemical vapor deposition (RPCVD), low pressure CVD (LPCVD), the like, or a combination thereof. In some examples, the process is RPCVD. In some examples, the inner portions 91 can include silicon phosphorous, silicon phosphorous carbide, or the like, wherein the inner portions 91 are in situ doped with the conductivity dopant species (e.g., an n-type dopant, like phosphorous in examples described herein). A silicon source precursor gas can be used for the RPCVD. The silicon source precursor gas can be a silicon-rich precursor gas, such as including silane ($SiH_4$), dichlorosilane ($SiH_2Cl_2$, DCS), trichlorosilane ($SiHCl_3$), or the like. In some examples, the silicon source precursor gas is silane. A flow rate of the silicon source precursor gas of the RPCVD can be in a range from about 20 sccm to about 80 sccm. The RPCVD process can also include a phosphorous source precursor gas. The phosphorous source precursor gas can include phosphine ($PH_3$), another phosphorous-containing precursor, and/or any combination thereof. In some examples, a ratio of the silicon source precursor to the phosphorous source precursor gas is in a range from about 2 to about 3. Carrier gases, such as hydrogen ($H_2$), can be mixed with the precursors. In some examples, the RPCVD process uses a silicon-rich precursor gas, such as silane, and a phosphorous source precursor gas, such as phosphine, with a hydrogen carrier gas. In some examples, a ratio of the silicon source precursor to the carrier gas is in a range from about 0.1% to about 1.5%. The ratio of the silicon source precursor to the carrier gas may be useful to achieve the convex source/drain region. For example, a higher ratio of silicon source precursor to the hydrogen carrier gas can help achieve a more convex shape source/drain region while a low ratio of the silicon source precursor to the hydrogen carrier gas can lead to a more wavy profile of the source/drain region. Use of the single silicon source precursor can grow bottom-up, and can reduce loading effects. A pressure of the RPCVD can be equal to or less than about 300 Torr, such as in a range from about 80 Torr to about 300 Torr, and more particularly, about 200 Torr. More particularly, a pressure of the RPCVD can be equal to or less than about 200 Torr, such as in a range from about 80 Torr to about 200 Torr, and more particularly, about 150 Torr. In some examples, a pressure of the RPCVD is in a range from about 10 Torr to about 200 Torr. In some cases, a pressure of smaller than 10 Torr for the RPCVD may provide an insufficient dopant concentration. In some cases, a pressure of greater than 200 Torr for the RPCVD may lead to selective loss. The pressure can vary depending on the particular process being used. A temperature of the RPCVD can be in a range from about 650° C. to about 750° C. A duration of the RPCVD can be in range from about 150 seconds to about 350 seconds. In some examples, the parameters may vary based on the process.

The inner portions 91 can have various concentrations of the conductivity dopant species. When phosphorous is implemented as the conductivity dopant species, e.g., from epitaxial growth with phosphorous, a concentration of phosphorous in the inner portions 91 of the epitaxial source/drain regions 94 can be in a range from about $1\times10^{21}$ cm$^{-3}$ to about $4\times10^{21}$ cm$^{-3}$.

In some examples, the deposition process forms an epitaxial layer, such as SiP, in recesses 90 and an amorphous material on non-crystalline surfaces. In some examples, after the deposition process, a post-deposition purge operation is used to remove the deposition gases from the process chamber. An inert gas, such as He, Ar, or Ne, could be used in this operation to purge the deposition gases from the process chamber. Once the deposition gases are removed from the chamber, the etch process follows.

The etching (or partial etching) process of the CDE process removes the amorphous material and may also remove a portion of the epitaxial layer in recesses 90. The remaining epitaxial layer is formed in each of the recesses 90 to form the inner portions 91 of the epitaxial source/drain regions 94. The etch process can be an in situ etch process performed in the chamber of the deposition process. In some examples, an etch gas is flowed into the chamber to etch the amorphous material. Etch gases such as chlorine (Cl$_2$), hydrochloric acid (HCl), or the like can be used. A pressure during the etch process can be equal to or less than about 200 Torr, such as in a range from about 2 Torr to about 200 Torr, and more particularly, equal to or less than about 50 Torr. A temperature during the etch process can be in range from about 630° C. to about 750° C. In some examples, after the etching process, a purge operation follows to remove the etching gases from the chamber.

The etching process can remove the amorphous material at a greater rate than the epitaxial material. Therefore, the epitaxial material remains on, e.g., the surfaces of the recesses 90 after the deposition-etch cycle. The deposition-etch cycle is repeated a number of times until a desired thickness is reached. As a result, such repeated deposition-etch process is called a cyclic deposition-etch process.

The first process forms the inner portions 91 in the recesses 90. The inner portions 91 may substantially fill the recesses 90. In some cases (e.g., due to blocking by the isolation regions 78), the inner portions 91 is first grown vertically in recesses 90, during which time the epitaxially grown material of the inner portions 91 does not grow horizontally. Once grown above the isolation regions 78, the epitaxially grown material grows both vertically and horizontally, which may form facets corresponding to crystalline planes of the semiconductor substrate 70 or may not form a facet. Further, due to horizontal growth, inner portions 91 in recesses 90 of neighboring fins 74 may approach merger and/or may merge together by coalescence of horizontal growth fronts. As shown in FIG. 4B, the inner portions 91 of the neighboring fins 74 have initiated merging.

Figures 5A, 5B:
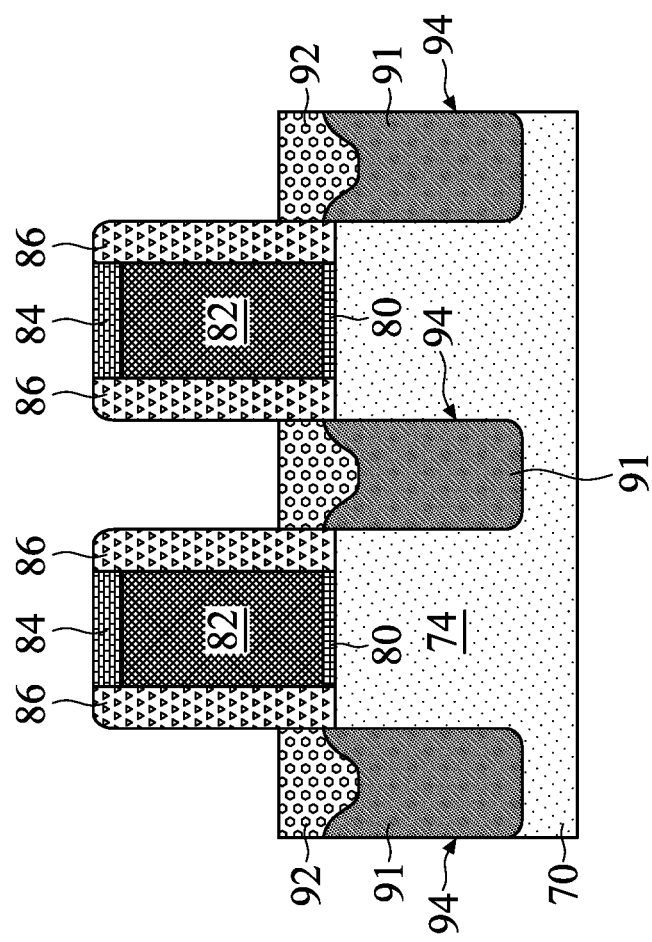

FIGS. 5A and 5B illustrate the formation of the outer portions 92 over the respective inner portions 91. In some examples, the outer portions 92 are formed by epitaxially growing the outer portions 92 on the respective inner portions 91. The outer portions 92 can be formed using a second epitaxy process. The second epitaxy process may be different than the first epitaxy, and/or the second epitaxy process may use different process parameters than the first epitaxy process. In some examples, the second epitaxy process is implemented by a CDE process. The CDE process includes a number of repeated cycles, such as in range from 1 cycle to 3 cycles. Each cycle of the CDE process includes a deposition process followed by an etch process.

The deposition process of the CDE process may include a CVD process, such as RPCVD, LPCVD, the like, or a combination thereof. In some examples, the process is RPCVD. In some examples, the outer portions 92 includes silicon phosphorous, silicon phosphorous carbide, or the like, and the outer portions 92 are in situ doped with the conductivity dopant species (e.g., an n-type dopant, like phosphorous in examples described herein). A silicon source precursor gas can be used for the RPCVD. The silicon source precursor gas can be a silicon-rich precursor gas, such as including silane, DCS, trichlorosilane, or the like. In some examples, the silicon source precursor gas is silane. A flow rate of the silicon source precursor gas of the RPCVD can be in a range from about 30 sccm to about 75 sccm. The RPCVD process can also include a phosphorous source precursor gas. The phosphorous source precursor gas can include phosphine (PH$_3$), another phosphorous-containing precursor, and/or any combination thereof. In some examples, a ratio of the silicon source precursor to the phosphorous source precursor gas is in a range from about 0.1 to about 0.5. Carrier gases, such as hydrogen (H$_2$), can be mixed with the precursors. In some examples, the RPCVD process uses a silicon-rich precursor gas, such as silane, and a phosphorous source precursor gas, such as phosphine, in a hydrogen carrier gas. A pressure of the RPCVD can be equal to or less than about 200 Torr, such as in a range from about 50 Torr to about 300 Torr. A temperature of the RPCVD can be in a range from about 650° C. to about 750° C. A duration of the RPCVD can be in range from about 100 seconds to about 200 seconds. In some examples, the parameters may vary based on the process.

The outer portions 92 can have various concentrations of the conductivity dopant species. When phosphorous is implemented as the conductivity dopant species, e.g., from epitaxial growth with phosphorous, the concentration of phosphorous in the outer portions 92 is greater than the concentration of phosphorous in the inner portions 91. A concentration of phosphorous in the outer portions 92 of the epitaxial source/drain regions 94 can be in a range from about $2.5 \times 10^3$ cm$^{-3}$ to about $4 \times 10^3$ cm$^{-3}$. Concentrations of phosphorous may be varied between the outer portion 92 and the inner portion 91 based on changes in the process parameters, such as flow rates of precursor gases, pressure, etc., of the first epitaxy process and the second epitaxy process that are capable of altering the concentrations.

In some examples, after the deposition process, a post-deposition purge operation is used to remove the deposition gases from the process chamber. Once the deposition gases are removed from the chamber, the etch process follows.

The etching (or partial etching) process of the CDE process removes amorphous material and may also remove a portion of the epitaxial layer of the outer portions 92 on the inner portions 91. The remaining epitaxial layer is formed on the inner portions 91 to form the outer portions 92 of the epitaxial source/drain regions 94. The etch process can be an in situ etch process performed in the chamber of the deposition process. An etch gas is flowed into the chamber to etch the amorphous material. The etching process for the outer portions 92 may be similar to etch process described above during formation of the inner portions 91. Etch gases such as chlorine ($Cl_2$), hydrochloric acid (HCl), germane ($GeH_4$), or the like, can be used. A pressure during the etch process can be less than or equal to about 200 Torr, such as in a range from about 2 Torr to about 200 Torr, and more particularly, equal to or less than about 50 Torr. A temperature during the etch process can be in range from about 650° C. to about 750° C. In some examples, after the etching process, a purge operation follows to remove the etching gases from the chamber.

The etching process can remove amorphous material at a greater rate than the epitaxial material. Therefore, the epitaxial material remains on, e.g., the inner portions 91 after the deposition-etch cycle. The deposition-etch cycle is repeated a number of times until a desired thickness is reached.

Process parameters and conditions used to implement the first epitaxy process and the second epitaxy process can promote increased vertical growth of the epitaxial source/drain regions 94 to form a convex shape at the top of the epitaxial source/drain region 94 laterally between neighboring fins 74. For example, the process parameters and conditions may promote an increased vertical growth rate to form the convex shape. For example, using a silicon-rich precursor gas in a hydrogen carrier gas at a pressure in a range from about 50 Torr to about 300 Torr (e.g., from about 50 Torr to about 200 Torr and at a temperature in a range from about 650° C. to about 750° C. may promote the vertical growth rate of the inner portions 91 and the outer portions 92. A ratio of the vertical growth rate of the first epitaxy process to the horizontal growth rate of the first epitaxy process can be in a range from about 1 to about 2, and a ratio of the vertical growth rate of the second epitaxy process to the horizontal growth rate of the second epitaxy process can be about 1.

Figure 5C:
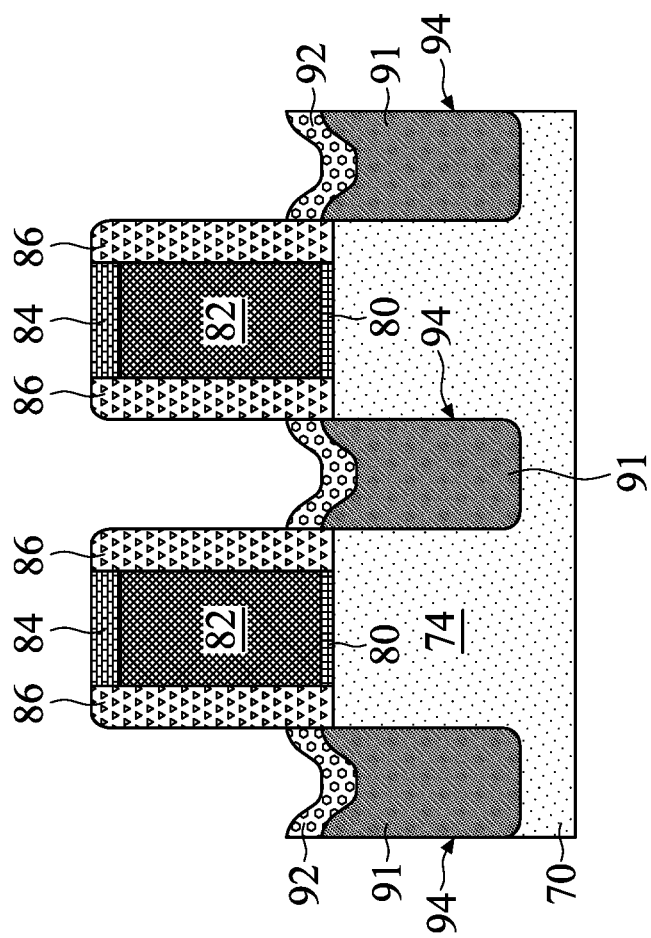
Figure 5D:
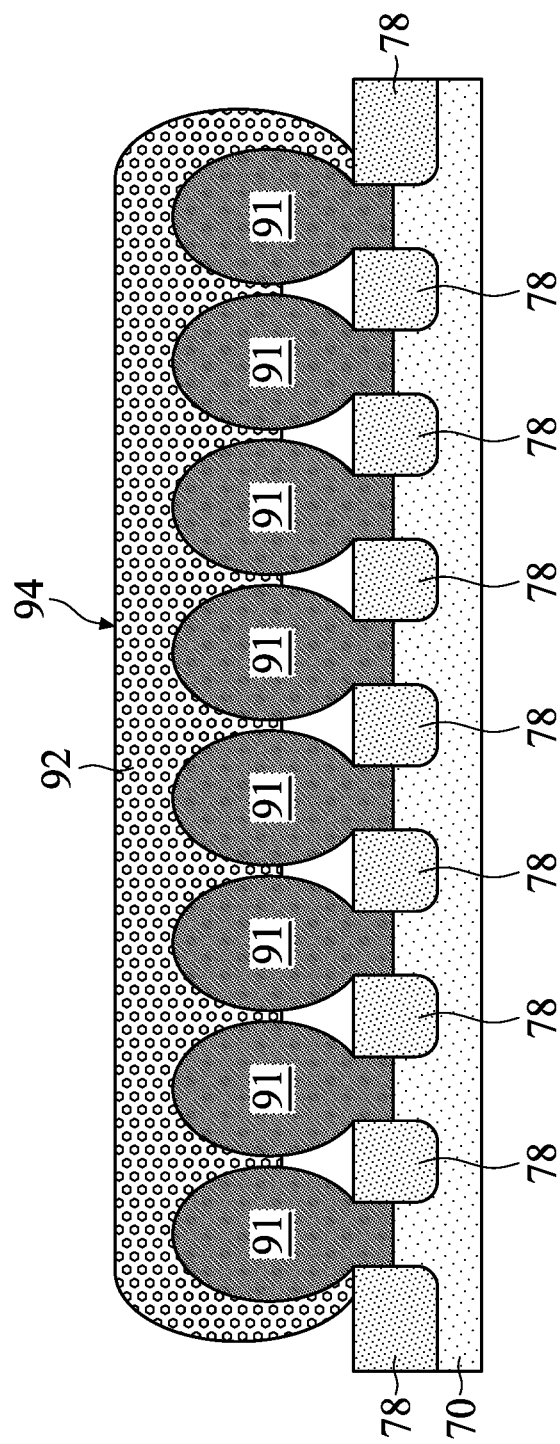

According to some examples, the structures illustrated in FIGS. 5A and 5B (and correspondingly, other figures ending in "A" and "B" in the process of FIGS. 1A-C through 8A-B) are in a core region (e.g., a logic region, such as a static random access memory (SRAM) region). In devices formed in a core region, fewer fins may be implemented to form a transistor, and a spacing between neighboring gates (and hence, a width of an intervening source/drain region) may be small. Structures in an input/output (I/O) region may be formed simultaneously as the corresponding structures in a core region. FIGS. 5C and 5D illustrate cross-sectional views of structures in an I/O region that are formed simultaneously with the structures of FIGS. 5A and 5B. FIG. 5C is a cross-section of a structure in the I/O region that corresponds to the cross-section of the structure in the core region of FIG. 5A, and FIG. 5D is a cross-section of a structure in the I/O region that corresponds to the cross-section of the structure in the core region of FIG. 5B.

As illustrated by FIG. 5C, a spacing S is between opposing gate spacers 86, which define where an intervening source/drain region 94 is formed. The spacing S for a device in the I/O region is, in some examples, at least three times larger than a corresponding spacing for a device in the core region. Further, as illustrated in FIG. 5D, eight fins are implemented to form a device having the merged epitaxial source/drain region 94. In other examples, other numbers of fins (e.g., such as more than eight) may be implemented to form a device having the merged epitaxial source/drain region 94.

As stated, the merged epitaxial source/drain regions 94 of devices in the core region and of devices in the I/O region can be formed simultaneously. However, the merged epitaxial source/drain regions 94 in the core region may have a different shape than the merged epitaxial source/drain regions 94 in the I/O region. For example, the upper surface of the outer portion 92 of the source/drain region 94 in the cross-section of FIG. 5C can have a substantially 'V' shape, whereas the upper surface of the outer portion 92 of the source/drain region 94 in the cross-section of FIG. 5A can be flat. Further, the levels of the top surfaces of the inner portions 91 in FIGS. 5A and 5C relative to the top surfaces of the fin 74 can differ (e.g., a top of the inner portion 91 in FIG. 5A is above the top surface of the fin 74, wherein a top of the inner portion 91 in FIG. 5C is below the top surface of the fin 74). Additionally, the merged epitaxial source/drain region 94 in the I/O region in the cross-section of FIG. 5D has a substantially flat surface between the fins 74, whereas the merged epitaxial source/drain region 94 in the core region in the cross-section of FIG. 5B has the convex shape described in detail herein.

The differences between the merged epitaxial source/drain regions 94 of the core region and of the I/O region may be attributable to a loading effect. As previously stated, the spacing S in the I/O region is greater than a corresponding spacing in the core region. Hence, a loading effect may occur during the deposition of the merged epitaxial source/drain regions 94. According to some examples, the loading effect may be reduced compared to previous methods. For example, use of a silane precursor, and in combination with other process parameters, can have better performance to reduce the loading effect. The reduced loading effect may obtain a greater thickness of the merged epitaxial source/drain regions 94 in the I/O region compared to previous methods.

Figure 6A:
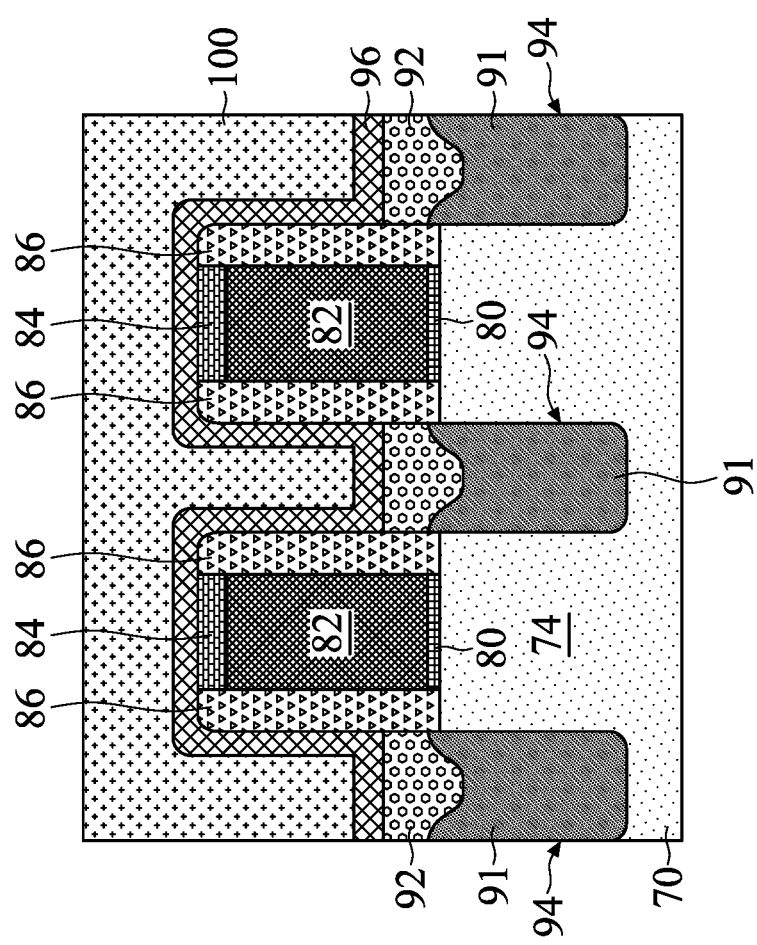
Figure 6B:
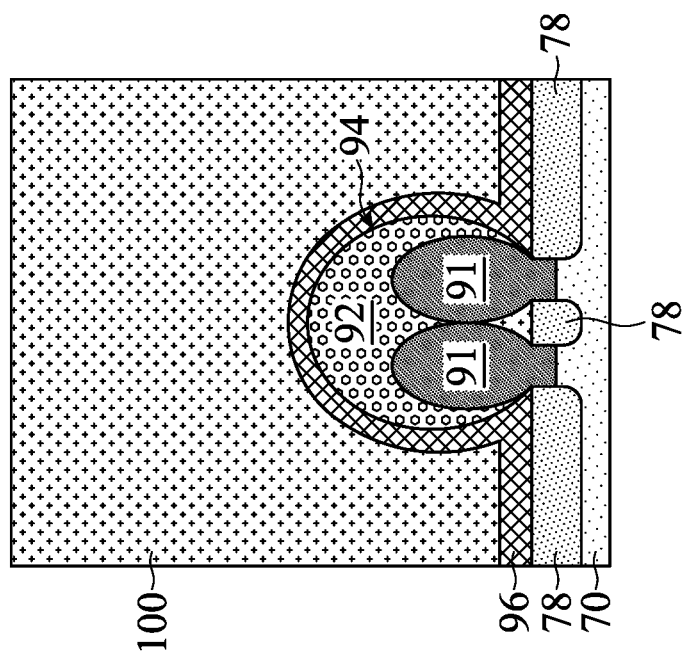

FIGS. 6A and 6B illustrate the formation of a contact etch stop layer (CESL) 96 and a first interlayer dielectric (ILD) 100. Generally, an etch stop layer can provide a mechanism to stop an etching process when forming, e.g., contacts or vias. In some examples, an etch stop layer is formed of a dielectric material having a different etch selectivity from adjacent layers, for example, the first ILD 100. The CESL 96 is conformally deposited over the epitaxial source/drain regions 94, dummy gate stacks, gate spacers 86, and isolation regions 78, and the first ILD 100 is deposited over the CESL 96. In some examples, the etch stop layer is or includes silicon nitride, silicon carbon nitride, carbon nitride, the like, or a combination thereof. In some examples, the first ILD 100 comprises or is silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The CESL 96 and first ILD 100 can be deposited by any appropriate deposition technique.

FIGS. 7A and 7B illustrate the replacement of the dummy gate stacks with replacement gate structures. A planarization process, such as a chemical mechanical planarization (CMP), is performed to level the top surface of the CESL 96 and first ILD 100 with the top surfaces of the dummy gates 82. The CMP may also remove the masks 84 (and, in some instances, upper portions of the gate spacers 86) on the dummy gates 82. Accordingly, top surfaces of the dummy gates 82 are exposed through the CESL 96 and first ILD 100. The dummy gates 82 and interfacial dielectrics 80 are then removed, such as by one or more etch processes, to expose respective channel regions in the fins 74.

Layers for forming the replacement gate structures can then be deposited where the dummy gate stacks were removed, such as by conformal deposition for some layers, and excess portions of those layers can be removed by a planarization process, such as a CMP, to form the replacement gate structures. The replacement gate structures each include, as illustrated in FIG. 7A, an interfacial dielectric 101, a gate dielectric layer 102, one or more optional conformal layers 103, and a gate conductive fill material 104.

The interfacial dielectric 101 is formed on sidewalls and top surfaces of the fins 74 along the channel regions where dummy gate stacks were removed. The interfacial dielectric 101 can be, for example, the interfacial dielectric 80 if not removed, an oxide (e.g., silicon oxide), nitride (e.g., silicon nitride), and/or another dielectric layer. A gate dielectric layer 102 is conformally deposited on the interfacial dielectric 101, along sidewalls of the gate spacers 86, and over the top surface of the CESL 96 and first ILD 100. The gate dielectric layer 102 can be or include silicon oxide, silicon nitride, a high-k dielectric material, multilayers thereof, or other dielectric material. In some examples, a high-k dielectric material has a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

Then, the one or more optional conformal layers 103 can be conformally (and sequentially, if more than one) deposited on the gate dielectric layer 102. The one or more optional conformal layers 103 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. In some examples, the one or more work-function tuning layer are or include a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

The gate conductive fill material 104 is formed over the gate dielectric layer 102 and/or the one or more optional conformal layers 103 (if implemented). The gate conductive fill material 104 can fill remaining regions where the dummy gate stacks were removed. In some examples, the gate conductive fill material 104 is or includes a metal-containing material such as tungsten (W), cobalt (Co), ruthenium (Ru), aluminum (Al), multi-layers thereof, or a combination thereof.

Figure 8B:
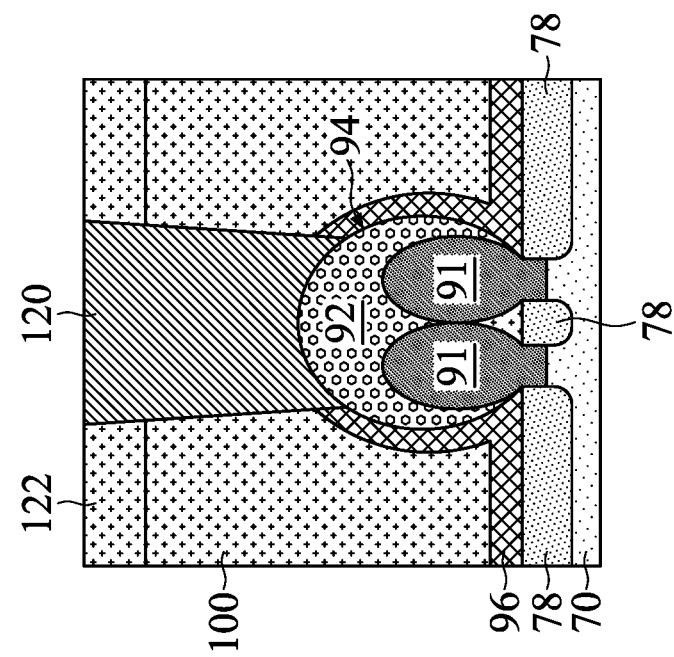
Figure 8A:
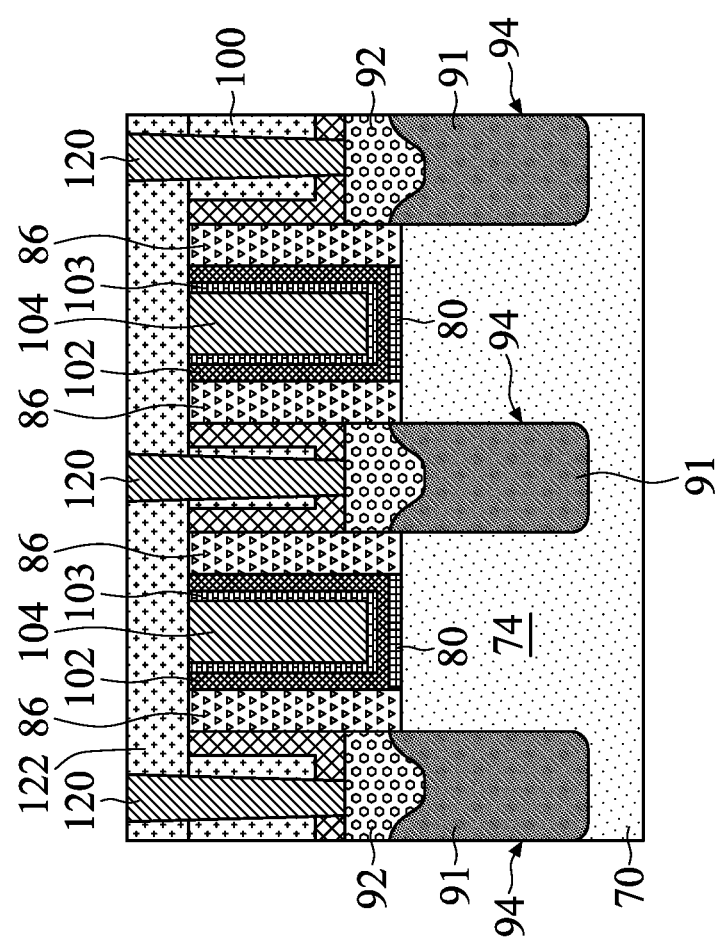

FIGS. 8A and 8B illustrate the formation of a second ILD 122 and conductive features 120 to the epitaxial source/drain regions 94. The second ILD 122 is deposited, such as by an appropriate deposition process, on top surfaces of the first ILD 100, replacement gate structures, and CESL 96. In some examples, the second ILD 122 is or includes silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. Openings can then be formed through the second ILD 122, first ILD 100, and CESL 96 to expose respective epitaxial source/drain regions 94, such as by using appropriate photolithography and etch processes.

Conductive features 120 are then formed in the openings to the epitaxial source/drain regions 94. The conductive features 120 can include a conformal adhesion and/or barrier layer along sidewalls of the opening (e.g., sidewalls of the first ILD 100 and second ILD 122) and a conductive fill material on the adhesion and/or barrier layer to fill the openings. In some examples, the conductive feature can be formed contacting the convex source/drain regions 94. Thus, as shown in FIG. 8B, the conductive feature 120 has a concave surface mating the convex surface of the epitaxial source/drain regions 94. In some examples, the adhesion and/or barrier layer are or include titanium, cobalt, nickel, titanium nitride, titanium oxide, tantalum nitride, tantalum oxide, the like or a combination thereof. In some examples, the conductive fill material is or includes tungsten, copper, aluminum, gold, silver, alloys thereof, or the like. In some examples, silicide regions are also formed on upper portions of the epitaxial source/drain regions 94. The silicide regions are formed by reacting upper portions of the epitaxial source/drain regions 94 with the adhesion and/or barrier layer. An anneal can be performed to facilitate the reaction of the epitaxial source/drain regions 94 with the adhesion and/or barrier layer. After the conductive fill material for the conductive features 120 is deposited, excess material is removed by using a planarization process, such as a CMP, to form top surfaces of the conductive features 120 coplanar with the top surface of the second ILD 122. The conductive features may be referred to as contacts, plugs, etc.

Formation of the epitaxial source/drain regions 94 as described above may prevent inter-fin epitaxial loss during further manufacturing stages including middle-end of line (MEOL) and back-end of line (BEOL) processes. In some examples, the convex shaped epitaxial source/drain regions 94 may improve performance of a conductive feature.

Figure 9A:
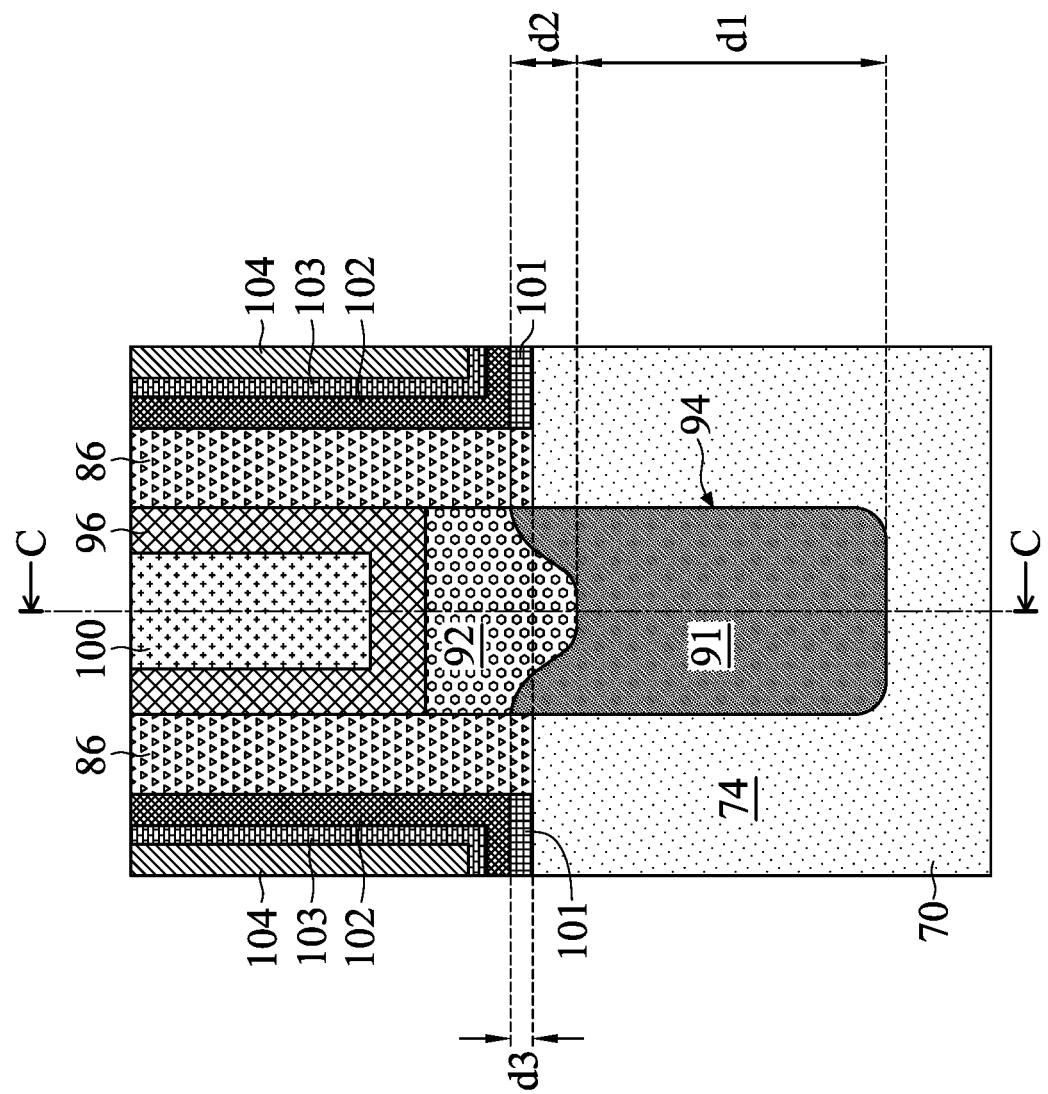
FIG. 9A is a cross-sectional view of a portion of the intermediate structure of FIG. 7A to illustrate further details in accordance with some embodiments.
Figure 9B:
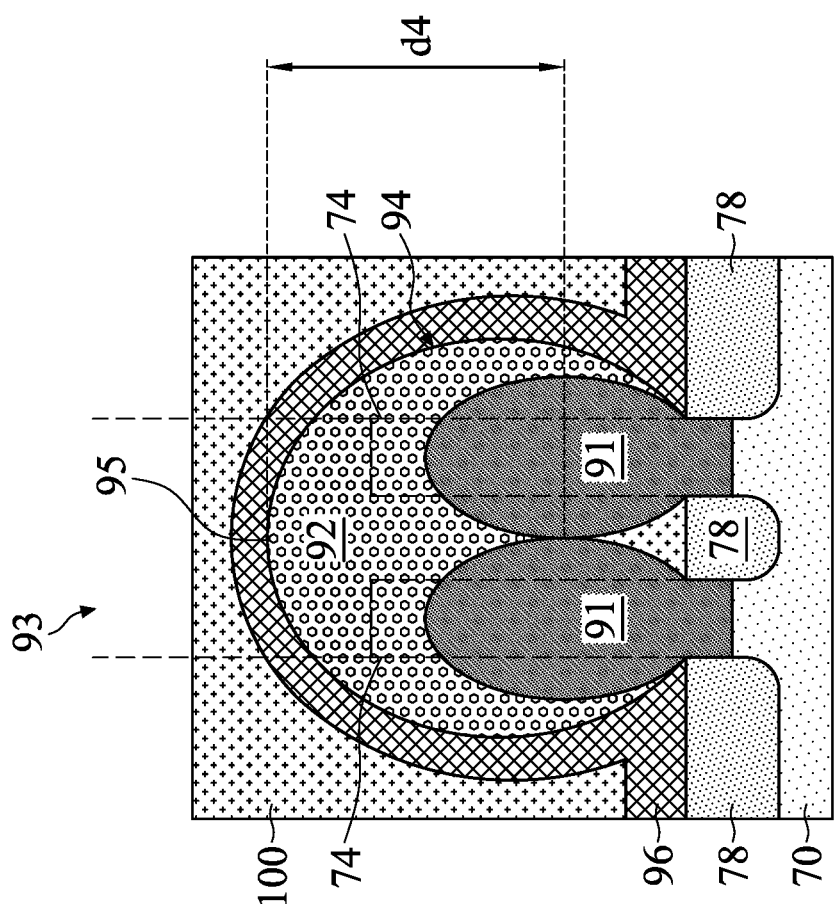
FIG. 9B is a cross-sectional view of a portion of the intermediate structure of FIG. 7B to illustrate further details in accordance with some embodiments.

FIGS. 9A and 9B illustrate respective portions of the intermediate structure of FIGS. 7A and 7B to illustrate additional details of the epitaxial source/drain regions 94. As shown in FIG. 9A, the inner portion 91 vertically fills the recess 90 to a thickness d1. In some examples, the thickness d1 is in a range from about 200 angstroms to about 400 angstroms. The inner portion 91 has a raised height (RH) d2 in a range from about 300 angstroms to about 500 angstroms. The raised height (RH) d2 refers to the height from a lowest upper surface of the inner portion 91 along the cross-section of FIG. 9A to a highest upper surface of the inner portion 91 along the cross-section. In some examples, the inner portion 91 extends a height d3 above the top of the fin 74 in a range from about 10 angstroms to about 70 angstroms. In some examples, a ratio of the raised height (RH) d2 to the thickness d1 is in a range from about 0.01 to about 0.2. The cross-section C-C in FIG. 9A corresponds to a plane in between two fins 74 and parallel to a plane of the cross-section B-B of FIG. 1.

As shown in FIG. 9B, a merged epitaxial source/drain region 94 is formed between neighboring fins 74. In some examples, the merged epitaxial source/drain region 94 has a thickness d4 laterally between the neighboring fins 74. In some examples, the thickness d4 is in a range from about 400 angstroms to about 600 angstroms. The thickness d4 is from a lower point at the coalescence or merger of the merged epitaxial source/drain region 94 to a highest point of the merged epitaxial source/drain region 94. As shown in FIG. 9B, in some examples, the merged epitaxial source/drain region 94 has a convex shape (e.g., an apophysis shape) laterally between the neighboring fins 74. In some examples, a top surface 95 of the merged epitaxial source/drain region 94 has a convex surface at least in the region 93 defined by respective planes extending perpendicular to top surfaces of the neighboring fins 74 from outer sidewalls of the neighboring fins 74. The top surface 95 of the merged epitaxial source/drain region 94 has a convex surface laterally across the region 93 defined by the planes. Thus, the merged epitaxial source/drain region 94 has the convex surface in the region 93 above and between the neighboring fins 74

In some examples, the convex shape of the merged epitaxial source/drain region 94 may result in improved characteristics. The convex shaped merged epitaxial source/drain regions 94 may have an increased thickness d4. In some cases, a flat or wavy shaped merged source/drain region may be broken during formation of the conductive feature, such as a result of epitaxial loss when etching the opening for the conductive feature. The broken (e.g., non-merged) source/drain region may lead to a higher contact resistance and degradation of performance. As shown in FIG. 8B, the convex shaped merged epitaxial source/drain regions 94 may be less likely to break during formation of the conductive feature 120. Further, the merged convex shaped merged epitaxial source/drain regions 94 may provide an increased landing area for the conductive feature 120, which may improve the parasitic resistance. Also, the merged epitaxial source/drain regions 94 can have increased volume, such as due to the convex shape. Even further, processing as described herein may result in improved fin coverage in forming the epitaxial source/drain regions 94 and may be independent of pattern loading.

In an embodiment, a method of manufacturing a semiconductor device is provided. The method generally includes forming a recess in a fin, the fin being on a substrate. The recess is proximate a gate structure over the fin. The method includes epitaxially growing a source/drain region in the recess using a remote plasma chemical vapor deposition (RPCVD) process. The RPCVD process includes using a silicon source precursor and a hydrogen carrier gas.

In another embodiment, a structure is provided. The structure generally includes a first fin on a substrate. The first fin has a first sidewall. The structure includes a second fin on the substrate. The second fin neighbors the first fin. The second fin has a second sidewall. The first sidewall is on a side of the first fin opposite from the second fin, and the second sidewall is on a side of the second fin opposite from the first fin. The structure includes a gate structure over the first fin and the second fin. The structure includes a merged epitaxial source/drain region on and between the first fin and the second fin proximate the gate structure. A top surface of the merged epitaxial source/drain region is convex extending continuously between a plane of the first sidewall and a plane of the second.

In another embodiment, the method generally includes etching a first recess in a first fin and a second recess in a second fin. The first fin and the second fin are on a substrate. The first fin has a first sidewall, and the second fin has a second sidewall. The first sidewall is on a side of the first fin opposite from the second fin, and the second sidewall is on a side of the second fin opposite from the first fin. The first recess and the second recess are proximate a gate structure over the first fin and the second fin. The method includes forming a source/drain region. Forming the source/drain region includes epitaxially growing a material along bottom surfaces and side surfaces of each of the first recess and second recess. The material fills the first and second recesses and merges laterally in a region above the first and second fins and between the first recess and the second recess to form the source/drain region. A top surface of the source/drain region has a convex shape extending continuously between a plane of the first sidewall to a plane of the second sidewall, and being laterally in the region above the first and second fins and between the first recess and the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first fin and a second fin protruding from a substrate;
    forming an isolation region between the first fin and the second fin;
    forming a first gate structure extending over the first fin and the second fin;
    removing a first portion of the first fin and a second portion of the second fin to form a first recess and a second recess, respectively, along a first side of the first gate structure; and
    forming a source/drain region along the first side of the first gate structure, wherein forming the source/drain region comprises:
    performing a first epitaxial process to form a first inner portion in the first recess and a second inner portion in the second recess, wherein an upper surface of the first inner portion and an upper surface of the second inner portion are convex; and
    performing a second epitaxial process to form an outer portion over the first inner portion and the second inner portion, wherein the first epitaxial process is different than the second epitaxial process, wherein the outer portion has a convex surface extending from directly above a first highest point of the first inner portion to directly above a second highest point of the second inner portion and being laterally between the first recess and the second recess.

2. The method of claim 1, wherein the first epitaxial process comprises a first remote plasma chemical vapor deposition (RPCVD) process and the second epitaxial process comprises a second RPCVD process.

3. The method of claim 2, wherein the first RPCVD process utilizes a first silicon source precursor and a first dopant source precursor, wherein the second RPCVD process utilizes a second silicon source precursor and a second dopant source precursor.

4. The method of claim 3, wherein a first ratio of the first silicon source precursor to the first dopant source precursor is greater than a second ratio of the second silicon source precursor to the second dopant source precursor.

5. The method of claim 4, wherein the first ratio is in a range of 2 to 3.

6. The method of claim 4, wherein the second ratio is in a range of 0.1 to 0.5.

7. The method of claim 2, wherein performing the first epitaxial process comprises performing a first cyclic deposition-etch (CDE) process, wherein performing the second epitaxial process comprises performing a second CDE process.

8. A method of manufacturing a semiconductor device, the method comprising:
forming a first fin and a second fin protruding from a substrate;
forming an isolation region between the first fin and the second fin;
forming a first gate structure extending over the first fin and the second fin;
removing a first portion of the first fin and a second portion of the second fin to form a first recess and a second recess, respectively, along a first side of the first gate structure; and
forming a source/drain region along the first side of the first gate structure, wherein forming the source/drain region comprises:
performing a first cyclic deposition-etch (CDE) process to form a first inner portion in the first recess and a second inner portion in the second recess, wherein an upper surface of the first inner portion and an upper surface of the second inner portion are convex; and
performing a second CDE process to form an outer portion over the first inner portion and the second inner portion, wherein the first CDE process comprises different process parameters than the second CDE process, wherein the outer portion has a convex upper surface extending continuously between a plane of a first sidewall of the first fin to a plane of a second sidewall of the second fin and being laterally between the first recess and the second recess.

9. The method of claim 8, wherein the first inner portion physically contacts the second inner portion.

10. The method of claim 8, wherein the first CDE process comprises 1 to 3 cycles.

11. The method of claim 8, wherein the second CDE process comprises 1 to 3 cycles.

12. The method of claim 8, wherein a thickness of the outer portion at a location aligned with an interface between the first inner portion and the second inner portion is in a range of 400 angstroms to 600 angstroms.

13. The method of claim 12, wherein a thickness of the first inner portion is in a range of 200 angstroms to 400 angstroms.

14. The method of claim 8, wherein a bottom surface of the first inner portion and a bottom surface of the second inner portion is lower than a top surface of the isolation region.

15. A method of manufacturing a semiconductor device, the method comprising:
forming a first fin and a second fin protruding from a substrate;
forming a first gate structure extending over the first fin and the second fin;
forming a second gate structure extending over the first fin and the second fin;
recessing the first fin and the second fin between the first gate structure and the second gate structure to form a first recess and a second recess, respectively;
forming a source/drain region interposed between the first gate structure and the second gate structure, forming the source/drain region comprising:
performing a first cyclic deposition-etch (CDE) process to form a first inner portion in the first recess and a second inner portion in the second recess, wherein the first inner portion physically contacts the second inner portion; and
performing a second CDE process to form an outer portion, wherein the outer portion extends completely over upper surfaces of the first inner portion and the second inner portion, wherein the first CDE process comprises different process parameters than the second CDE process, wherein the outer portion having a convex upper surface extending continuously between a plane of a first sidewall of the first fin to a plane of a second sidewall of the second fin and being laterally between the first recess and the second recess.

16. The method of claim 15, wherein the first gate structure and the second gate structure are dummy gate structures, and further comprising replacing the dummy gate structures with a first replacement gate structure and a second replacement gate structure, respectively.

17. The method of claim 15, wherein an upper surface of the first inner portion along a direction extending between the first gate structure and the second gate structure comprises a concave section.

18. The method of claim 15, wherein the first CDE process and the second CDE process each comprises a remote plasma chemical vapor deposition (RPCVD) process, wherein each RPCVD process includes a silicon source precursor gas, a dopant source precursor gas, and a carrier gas.

19. The method of claim 18, wherein the dopant source precursor gas comprises a phosphorous source precursor gas.

20. The method of claim 18, wherein the first inner portion and the second inner portion has a lower concentration of a dopant than the outer portion.

* * * * *